United States Patent [19]

Druegh et al.

[11] 4,419,634
[45] Dec. 6, 1983

[54] OSCILLATOR WHOSE FREQUENCY IS CONTROLLABLE BY A CURRENT VARIATION

[75] Inventors: Paul Druegh; Kalixt von Winnicki, both of Munich, Fed. Rep. of Germany

[73] Assignee: Siemens Aktiengesellschaft, Berlin & Munich, Fed. Rep. of Germany

[21] Appl. No.: 226,850

[22] Filed: Jan. 21, 1981

[30] Foreign Application Priority Data

Jan. 30, 1980 [DE] Fed. Rep. of Germany ........ 3003302

[51] Int. Cl.³ .............................................. H03B 5/12
[52] U.S. Cl. .............................. 331/117 R; 331/177 R
[58] Field of Search ................ 331/1 A, 8, 26, 28, 331/34, 108 A, 108 C, 108 D, 115, 117 R, 168, 177 R, 109, 36 L, 36 C

[56] References Cited

U.S. PATENT DOCUMENTS

| | | | |
|---|---|---|---|
| 3,811,097 | 5/1974 | Dijkmans | 331/109 X |
| 3,815,052 | 6/1974 | Watatani et al. | 331/117 R |
| 4,061,987 | 12/1977 | Nagahama | 331/177 X |
| 4,071,832 | 1/1978 | Cloke | 331/117 R |

FOREIGN PATENT DOCUMENTS

2803400 7/1979 Fed. Rep. of Germany .
2446560 1/1979 France .

OTHER PUBLICATIONS

R. R. Cordell, "Integrated Circuit Phase-Locked Loops", Conference Record 1976, Intern. Conf. on Communications, 12th IEEE Conference, Philadelphia, Jun. 14–16, 1976.

Primary Examiner—Siegfried H. Grimm
Assistant Examiner—Tim A. Wiens
Attorney, Agent, or Firm—Hill, Van Santen, Steadman & Simpson

[57] ABSTRACT

A controllable LC oscillator has a constant inductance and a constant capacitance. In an oscillator circuit comprising a parallel resonant circuit, voltage limiting components are connected in parallel with the resonant circuit. By way of a controllable impressed current source, the starting point of voltage limitation is controlled and, hence, an alteration of the oscillator frequency is effected. In addition, a dual of the oscillator circuit is provided comprising a series resonant circuit.

10 Claims, 7 Drawing Figures

OSCILLATOR WHOSE FREQUENCY IS CONTROLLABLE BY A CURRENT VARIATION

BACKGROUND OF THE INVENTION

1. Field of the Invention

The present invention relates to an oscillator whose frequency is controllable by a current variation and it is intended that such an oscillator replace the presently-employed voltage-controlled oscillators.

2. Description of the Prior Art

Numerous voltage-controlled oscillators (VCO) are known in the art. In most of such oscillators, the oscillator frequency is altered via capacitance diodes. From the German Letters Pat. No. 2,803,400 an oscillator circuit is known which, via a current distributor circuit, connects an additional capacitance to the resonant circuit capacitance. Also in this circuit, a reactance is varied.

In the article "*Integrated Circuit Phase-Locked Loops*", by R. R. Cordell, from the Conf. Record, 1976, Intern. Conf. on Communications, 12th IEEE Intern. Conf., Philadelphia, June 14–16, 1976, pp. 10-12 to 10-16 TIB-RN 272 (12), current-controlled oscillators (CCO) are described on Pages 10-13 to 10-15.

In FIG. 6 of the above article, a multivibrator whose frequency is controlled by emitter currents is disclosed. A frequency-determining capacitance is reversed at varying speed. However, this circuit exhibits disadvantages which are known per se in the case of multivibrators, such as an unclean frequency spectrum and poor frequency stability. Moreover, an applicable oscillator circuit requires a considerable circuit expense.

SUMMARY OF THE INVENTION

It is the object of the present invention to provide a controllable oscillator having a simple circuit design.

According to the invention, the above object is achieved in that an amplifier is provided, that a parallel resonant circuit having constant reactances is provided which is connected to the output of the amplifier and is fed back to the input of the amplifier, that a voltage-limiting component is connected in parallel with the parallel resonant circuit, and that a controllable constant current source is provided by way of which the output current of the amplifier is varied.

Underlying the invention is the recognition that the frequency of an oscillator can be altered by limiting the voltage at the parallel resonant circuit. By controlling the starting point of the voltage limitation, the oscillator frequency is also altered. The control of the voltage limitation and, hence, the control of the oscillator frequency advantageously proceeds by altering the output current of the amplifier of the oscillator circuit.

An advantage of this circuit is that no controllable reactances of any kind are required. The manufacture of an LC oscillator constructed in accordance with the present invention is correspondingly economical. The circuit likewise is suitable for monolithic integration.

An advantageous design of an oscillator, in accordance with the present invention, is characterized in that, as an amplifier, an emitter-coupled differential amplifier having a controllable impressed current source is employed, and that the parallel resonant circuit is connected between the collector of the first transistor of the differential amplifier and the supply voltage.

Given this embodiment, the circuit of the controllable LC oscillator is particularly simple.

Moreover, integrated components can be employed which already contain the transistors of an emitter-coupled differential amplifier and an impressed current source.

It is advantageous if the output voltage of the oscillator is tapped at the collector of the second transistor of the emitter-coupled differential amplifier.

A good decoupling of the oscillator circuit from the output thereby results.

It is furthermore advantageous if, as a controllable impressed current source for the differential amplifier, a second differential amplifier is provided which has two additional emitter-coupled transistors, in which the collector of one of the transistors, whose base is maintained at a constant potential, is connected with the emitters of the two transistors of the first emitter-coupled amplifier, whereas the collector of the other transistor—at the input of which the frequency-determining control voltage Uf is connected—is connected to the supply potential.

The advantageous result achieved by the above-mentioned current source is that the frequency of the LC oscillator is controlled by a control voltage.

If the impressed current source is so designed that it has the same temperature variation characteristic as the voltage limiting element which is disposed parallel to the resonant circuit, then the oscillator becomes independent of temperature.

The above object is also achieved, according to the present invention, in a second embodiment that there is connected, to the output of an amplifier, a series resonant circuit which is fed back to the input of the amplifier, that there is connected, in series with the resonant circuit, a current limiting component, and that a voltage source is provided which determines the output voltage of the amplifier, and that the current limiting component and/or the voltage source is controllable.

This second embodiment is dual to the first. A series resonant circuit has replaced the parallel resonant circuit; current and voltage at the resonant circuit behave correspondingly.

BRIEF DESCRIPTION OF THE DRAWINGS

Other objects, features and advantages of the invention, its organization, construction and operation, will be best understood from the following detailed description, taken in conjunction with the accompanying drawings, on which.

DESCRIPTION OF THE PREFERRED EMBODIMENTS

Figure 1:
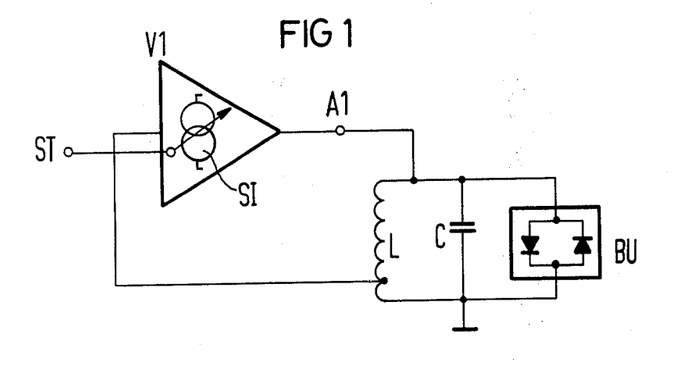
FIG. 1 is a schematic circuit diagram of an oscillator constructed in accordance with the present invention.

FIG. 1 illustrates a basic circuit diagram of an oscillator constructed in accordance with the invention. A parallel resonant circuit LC is connected to the output A1 of an amplifier V1. A tap of the coil L of the parallel resonant circuit is fed back to the input of the amplifier V1. A voltage limiting component BU is connected in parallel with the parallel resonant circuit LC. Antipolar connected diodes, Zener diodes or transistors are suitable for voltage limitation. The output current of the amplifier is determined via a control input ST by a controllable current source SI.

Figure 2:
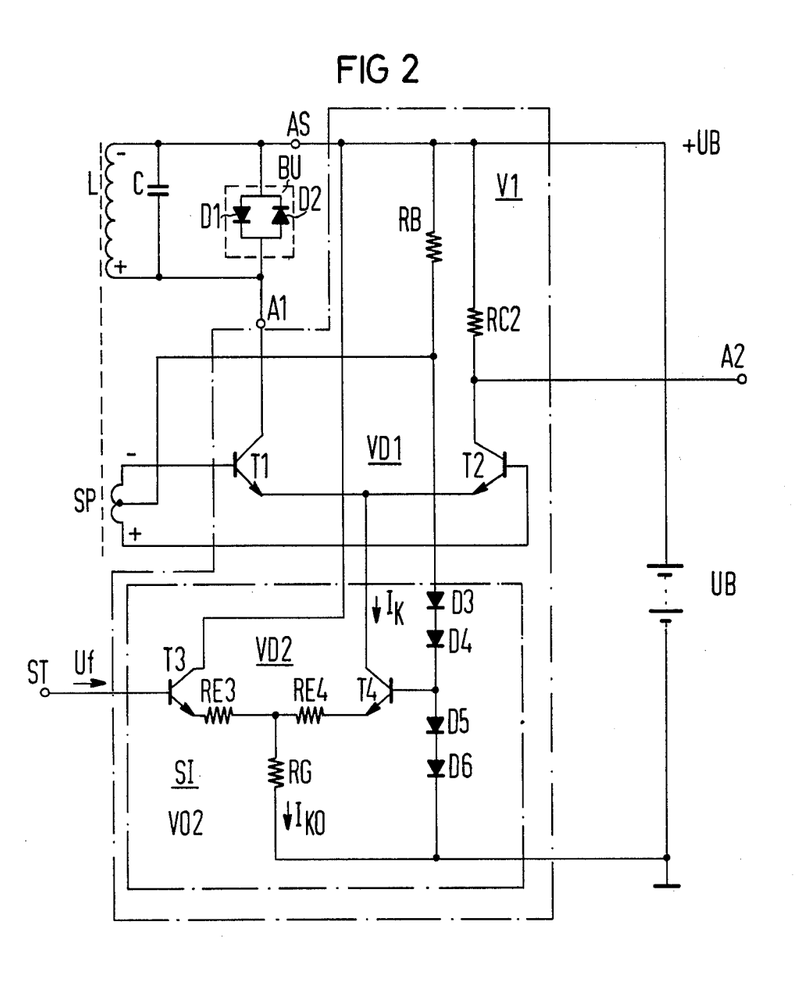
FIG. 2 is a detailed circuit diagram of an oscillator constructed in accordance with a first embodiment of the invention.

In FIG. 2, an exemplary embodiment of a controllable oscillator constructed in accordance with the present invention is illustrated in detail. In the oscillator circuit, an emitter-coupled differential amplifier VD1 is provided having two npn transistors T1 and T2. A parallel resonant circuit, comprising an inductance L and a capacitance C is connected to the collector of the first transistor T1, at a connection point A1. A second connection point AS of the parallel resonant circuit is connected to a supply potential +UB. The voltage limitation circuit BU is connected in parallel with the resonant circuit LC and comprises two diodes D1 and D2 which are connected in an anti-polar fashion. A coil SP is coupled with the inductance L of the parallel resonant circuit. One connection each of the coil SP is connected to the base of the transistor T1 and, respectively, to the base of the transistor T2. The base bias voltage of the transistors T1 and T2 is generated by the series connection of an ohmic resistor RB and four diodes D3–D6 which are connected in series in the forward direction, whereby one connection of the resistor is connected to the supply potential +UB and the last diode D6 of the series is connected to ground. The second connection point of the resistor RB, which connection point is connected with the diode D3, supplies, via a center tap of a coil SP, the base bias voltage for the transistors T1 and T2.

The collector of the second transistor T2 is connected, by way of an ohmic resistor RC2, to the supply potential +UB. Moreover, the collector of the second transistor T2 is connected to a connection point A2, serving as the output of the oscillator circuit.

As the controllable current source SI, a second differential amplifier VD2, comprising two emitter-coupled npn transistors T3 and T4 is employed. The emitters are respectively interconnected by way of a balancing resistor RE3 or RE4 and are connected to a common emitter resistor RG whose other terminal is connected to ground. The collector of the transistor T4 is connected with both emitters of the first differential amplifier VD1. The base of the transistor T4 is connected to the junction of the diodes D4 and D5, so that a constant voltage is always connected to the base of the transistor T4. The collector of the emitter-coupled transistor T3 is directly connected to the supply potential +UB. The base of the transistor T3 is connected to a control input ST.

Serving as a current supply for the entire oscillator circuit is a d.c. source, here a battery UB, which delivers the supply potential +UB. The other pole of the battery is connected to ground.

Figure 3:
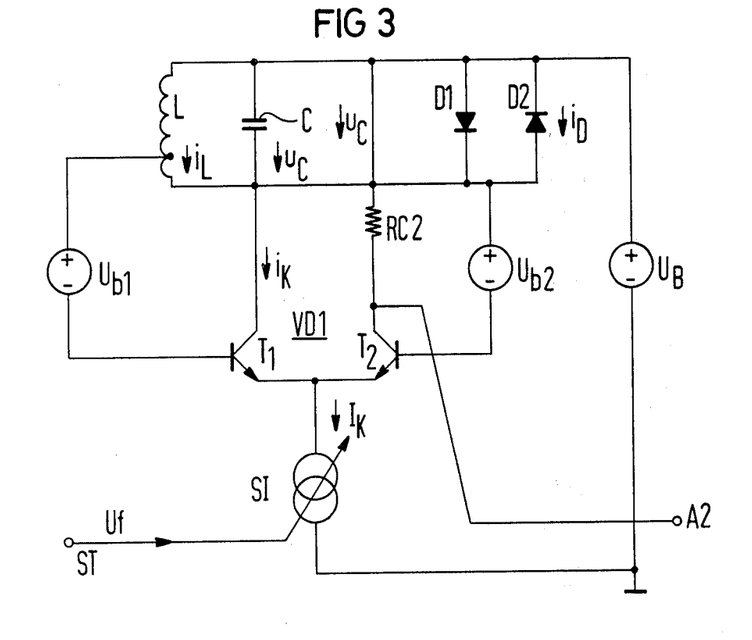
FIG. 3 is a (detailed) equivalent circuit diagram of the oscillator of FIG. 2.

The basic circuit diagram of the oscillator according to FIG. 2 is illustrated in FIG. 3 in order to simplify the understanding thereof. The representation of the first differential amplifier VD1 with its emitter-coupled transistors T1 and T2 is maintained. Likewise maintained is the illustration of the parallel resonant circuit with the inductance L and the capacitor C, and the diodes D1 and D2 connected in parallel therewith in opposite polarity fashion. The collector of the transistor T1 is fed back by way of a voltage source $U_{b2}$ to the base of the transistor T2 and the base of the transistor T1 is connected by way of a voltage source $U_{b1}$ to the tap of the inductor L. The voltage sources $U_{b1}$ and $U_{b2}$ generate the base bias voltages for the transistors. The collector of the transistor T2 is connected by way of a resistor RC2 to the supply potential +UB and is connected to the output terminal A2.

The controllable current source SI with the control input ST is only symbolically illustrated. On the one hand, it is connected to the emitters of the transistors T1 and T2 of the first differential amplifier VD1, and, with a second connection point is connected to ground. Again, the oscillator circuit is supplied with a d.c. source UB.

Through the current source SI a current $I_K$ flows, whose magnitude is dependent upon the control voltage Uf connected to the input terminal ST. In all illustrations, the calculated current direction from the positive to the negative potential is indicated. A current flowing through the inductor L is referenced $i_L$; the voltage prevailing at the resonant circuit is referenced $u_C$; and the current flowing through the transistor T1 is referenced $i_K$.

FIG. 2 represents an oscillator circuit in which the resonant circuit frequency is fed back to the input of the differential amplifier. As long as no limitation whatsoever occurs, this oscillator will oscillate at the frequency $$f_o = \tfrac{1}{2}\pi \sqrt{LC} .$$

If, however, a limitation of a resonant circuit voltage by the diodes D1 and D2 occurs, the frequency of the oscillator decreases. The use of the voltage limitation, in the case of a specified limiter voltage, is determined by the resonant circuit voltage $u_C$. The latter is, in turn, dependent upon the current $i_K$ flowing through the transistor T1 and, hence, is dependent upon the impressed current $i_K$ flowing through the controllable current source SI.

The oscillator circuit is so dimensioned that either the transistor T1 or the transistor T2 is fully conductive. This signifies that the current $i_K$ flows through the transistor T1 or through the transistor T2.

Reference is once again made to FIG. 2 regarding the operation of the controllable compressed current source SI. The current source is formed by the differential amplifier VD2. By way of the control input ST a control voltage Uf is connected to the base of the transistor T3 of the differential amplifier VD2. It is assumed that the transistor T3 is blocked by the control voltage Uf. The entire current $i_K$ then flows by way of the transistor T4 and the resistors RE4 and RG. The constant voltage, connected to the base of the transistor T4, which is tapped at the junction of the diodes D4 and D5, and the emitter resistors RG and RE4 determine the dimension of the impressed current $I_{K0}$ of the differential amplifier VD2.

If the control voltage Uf at the base of the transistor T3 now changes, then a portion of the current $I_{K0}$, flowing by way of the resistor RG, is diverted by way of the resistor RE3 in the emitter circuit of the transistor T3. Therefore, a correspondingly reduced current $I_K$ flows through the transistor T4. This is the impressed current of the differential amplifier VD1.

Figure 4:
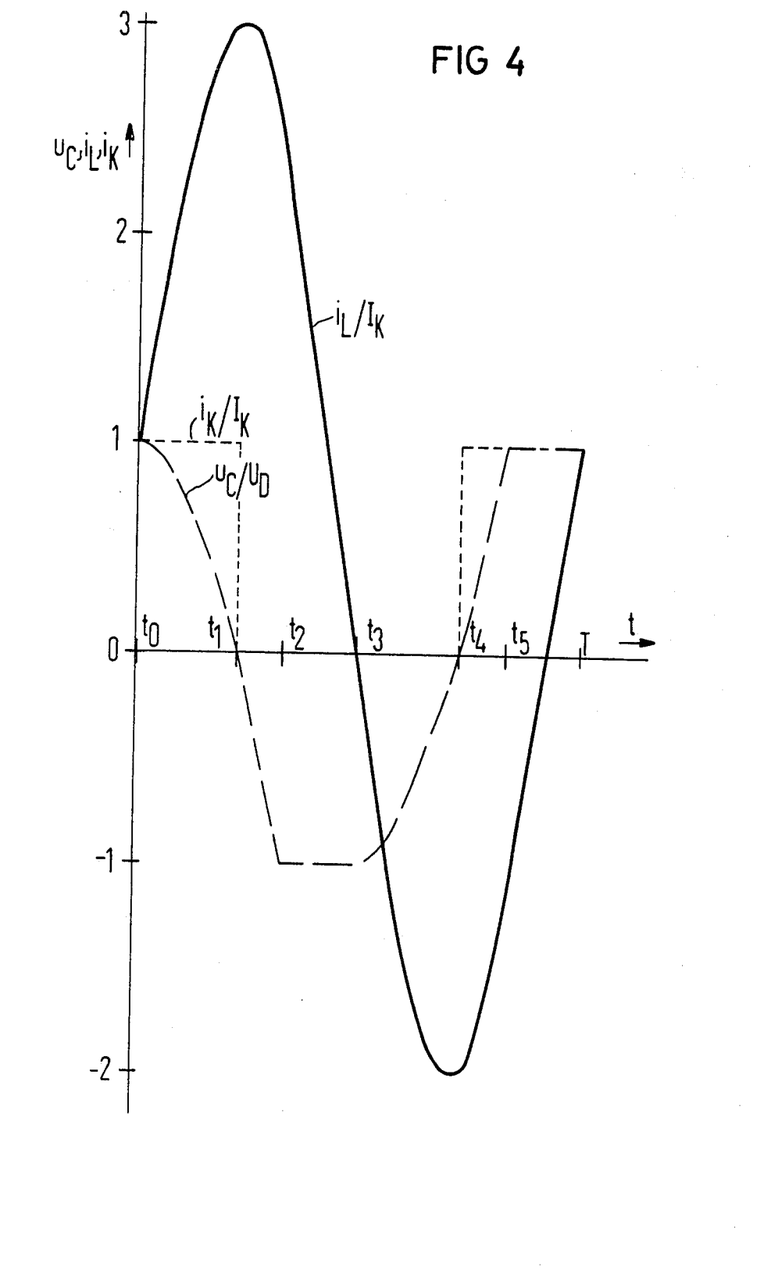
FIG. 4 is a graphic illustration which is a time diagram for the operation of the oscillator of FIG. 2, which illustrates the voltage and current characteristics of the oscillator circuit.

In the timing diagram of FIG. 4, a period of the current and voltage characteristic of the tank circuit LC in the steady-state condition is illustrated in a conventional manner. The curve for the current $i_L$ flowing through the inductor is illustrated as a solid line. The voltage wave form $u_C$ at the tank circuit is illustrated with a broken line; and the current $i_K$ flowing through the transistor T1, is illustrated as a short broken line.

On the time access the salient time points are marked $t_1$, $t_2$, $t_3$, etc. The beginning of the illustrated period is designated $t_0$, and the end of this period as T. At the time $t_0$, no voltage limiting by the diodes D1 and D2 exists. The voltage $u_C$ at the tank circuit is that of a free oscillation having the radian frequency $$\omega_o = 1/\sqrt{LC}.$$

At the time $t_1$, the transistor T1 is blocked so that the current $i_K$ flowing through the transistor T1 becomes zero. The voltage wave form at the resonant circuit also continues to take place with the same angular frequency $\omega_o$, whereby, however, the amplitude of the wave form, conditioned by the disconnection of the current $i_K$, has been altered. At the time $t_2$ the limiter effect of the diodes D1 and D2 begins. As a consequence, the voltage at the tank circuit can no longer increase. The current $i_L$, flowing through the inductor, continues to decrease. At the time $t_3$ the voltage limiting effect of the diodes D1 and D2 is again canceled. The voltage wave form at the tank circuit again corresponds to that of a free oscillation up to the time $t_4$. From this time on, the transistor T1 is again rendered conductive. The voltage wave form at the tank circuit continues with the frequency of a free oscillation, however, conditioned by the current changed $i_K$, with an increased amplitude. At the time $t_5$ the voltage limiting effect of the diodes D1 and D2 again begins while the current $i_L$ flowing through the inductor continues to increase. At the time T the voltage limiting effect of the diodes D1 and D2 ends, with which an oscillatory period is terminated and the voltage wave form is repeated. The period of an oscillation was extended virtually by the time intervals $t_2$ to $t_3$ and $t_5$ to T as compared with a period of a free oscillation.

Through an increase of the impressed current $I_K$ of the differential amplifier VD1, the time intervals $t_2$ to $t_3$ and $t_5$ to T, in which a limiting effect of the diodes D1 and D2 occurs, are likewise increased. Therefore, the oscillator frequency is dependent on the impressed current $i_K$.

The current characteristic and the voltage characteristic of the tank circuit can be determined by calculation. In the time intervals $t_0$ to $t_1$; $t_1$ to $t_2$, etc, the following differential equations apply:

$t_0-t_1$:

$$C\, du_C/dt + i_L = I_K \quad \text{(DG 1.1)}$$

$$L\, di_L/dt = u_C \quad \text{(DG 1.2)}$$

$t_1-t_2$:

$$C\, du_C/dt + i_L = 0 \quad \text{(DG 2.1)}$$

$$L\, di_L/dt = u_C \quad \text{(DG 2.2)}$$

$t_2-t_3$:

$$i_D + i_L = 0 \quad \text{(DG 3.1)}$$

$$L\, di_L/dt = u_D \quad \text{(DG 3.2)}$$

$t_3-t_4$:

$$C\, du_C/dt + i_L = 0 \quad \text{(DG 4.1)}$$

$$L\, di_L/dt = u_C \quad \text{(DG 4.2)}$$

$t_4-t_5$:

$$C\, du_C/dt + i_L = I_K \quad \text{(DG 5.1)}$$

$$L\, di_L/dt = u_C \quad \text{(DG 5.2)}$$

$t_5-T$:

$$i_D + i_L = I_K \quad \text{(DG 6.1)}$$

$$L\, di_L/dt = U_D \quad \text{(DG 6.2)}$$

If one regards the diodes D1 and D2 as ideal limiters, the solution for the differential equation system can be determined as follows. For every interval within a period, a specific solution can be indicated which, at the beginning and the end of the interval, always merges into the specific solutions of the adjacent interval. Altogether, all solutions thus obtained form the solution for the current characteristic and the voltage characteristic in the steady-state condition. The graphic illustration of the solution is set forth in FIG. 4.

In the intervals $0 \leq t \leq t_2$ and $t_3 \leq t \leq t_5$, the following general solution results:

$$u_C(t) = U_{CO} \cos\omega_0 (t - t_K)\, t + i_K(t) - I_{LO}\sqrt{L/C}\, \sin\omega_0(t - t_x)$$

$$i_L(t) = I_{LO} - i_K(t)\cos\omega_0(t - t_x) + U_{CO}\sqrt{C/L}\, \sin\omega_0(t - t_x) + i_K(t)$$

where $U_{CO}$, $L_{LO}$ are the initial values for $u_C$ and $i_L$ at the interval boundaries $t_x = t_0$, $t_1$, $t_3$, $t_4$.

For the time intervals $t_2 \leq t \leq t_3$ and $t_5 \leq t \leq T$ the following holds true:

$$u_C(t) = U_{CO} = U_D$$

$$i_L(t) = -\frac{U_{CO}}{L}(t - t_x) + I_{LO}$$

where $U_{CO}$, $L_{LO}$ are the respective initial values for $u_C$, $i_L$ at the interval boundaries $t_x = t_2$, $t_5$.

The solutions are herewith provided as equations GL 1.1–GL 6.2 for the differential equations DG 1.1–DG 6.2

$0 \leq t \leq t_1$:

$$u_C(t) = U_D \cos \omega_o t \quad \text{(GL 1.1)}$$

$$i_L(t) = U_D \sqrt{C/L} \sin \omega_0 t + I_K \quad \text{(GL 1.2)}$$

$t_1 \leq t \leq t_2$:

$$u_C(t) = -(I_K \sqrt{L/C} + U_D) \sin \omega_o(t - t_1) \quad \text{(GL 2.1)}$$

$$i_L(t) = (I_K + U_D \sqrt{C/L}) \cos \omega_o(t - t_1) \quad \text{(GL 2.2)}$$

$t_2 \leq t \leq t_3$:

$$u_C(t) = -U_D \quad \text{(GL 3.1)}$$

$$i_L(t) = -U_D/L \cdot (t - t_2) + I_K \sqrt{1 + 2U_D/I_K \sqrt{L/C}} \quad \text{(GL 3.2)}$$

$t_3 \leq t \leq t_4$:

$$u_C(t) = -U_D \cos \omega_o (t - t_3) \quad \text{(GL 4.1)}$$

$$i_L(t) = -U_D \sqrt{C/L} \sin \omega_o (t - t_3) \quad \text{(GL 4.2)}$$

$t_4 \leq t \leq t_5$:

$$u_C(t) = (U_D + I_K \sqrt{L/C}) \sin \omega_o (t - t_4) \quad \text{(GL 5.1)}$$

$$i_L(t) = -(U_D \sqrt{C/L} + I_K) \cos \omega_o (t - t_4) + I_K \quad \text{(GL 5.2)}$$

$t_5 \leq t \leq t$:

$$u_C(t) = +U_D \quad \text{(GL 6.1)}$$

$$i_L(t) = U_D/L \cdot (t - t_5) - I_K(\sqrt{1 + 2U_D/I_K \sqrt{L/C} - 1}) \quad \text{(GL 6.2)}$$

Figure 5:
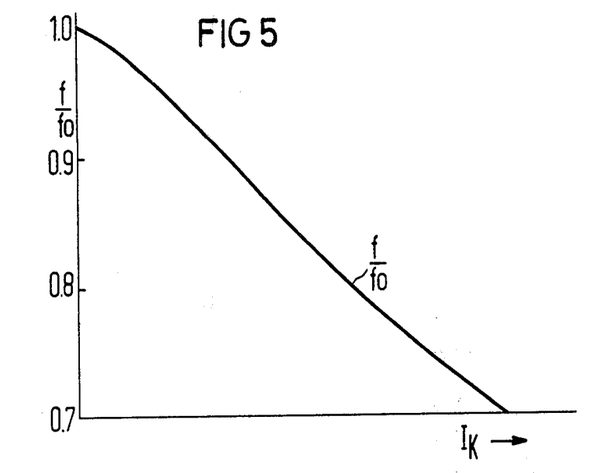
FIG. 5 is a graphic illustration of the standardized frequency characteristic of the oscillator as a function of the control current.

On the basis of these solutions, the period and its dependency upon the impressed current $i_K$ can be calculated. This relationship is graphically illustrated in FIG. 5.

In a supplementary manner, the following is to be additionally set forth regarding the graphic illustration of FIG. 4. If, in an oscillator circuit, a current of the magnitude $\pm i_K$ is connected at the parallel resonant circuit LC, then a symmetric characteristic of the currents and voltages for the resonant circuit results.

Figure 6:
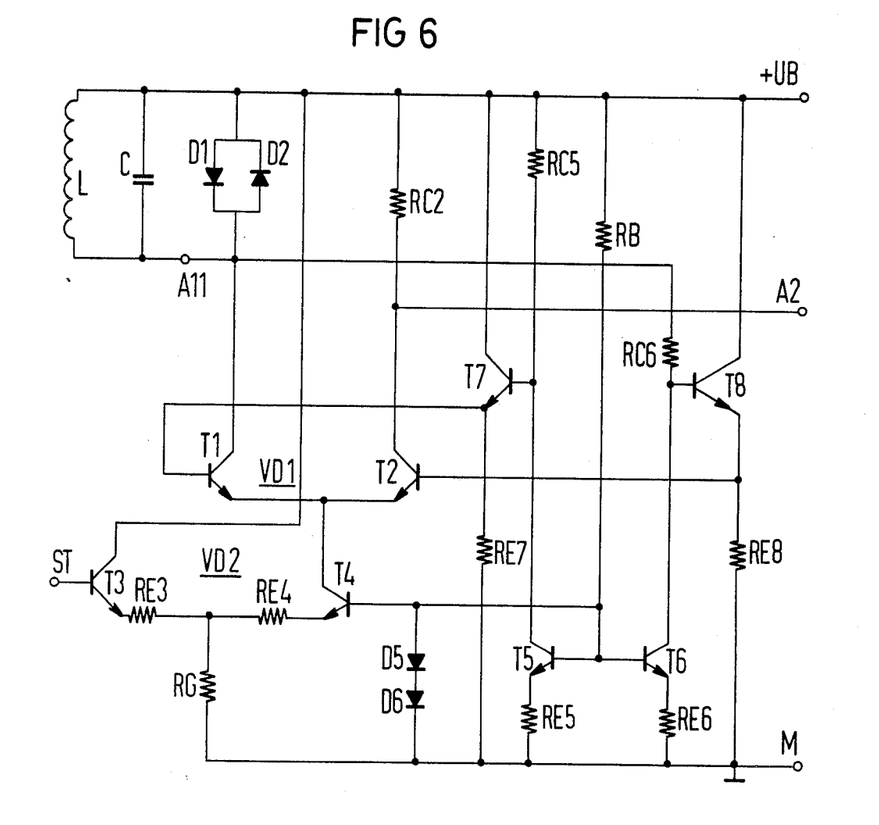
FIG. 6 is a detailed schematic circuit diagram of an LC oscillator suitable for monolithic integration and constructed in accordance with the present invention.

The integratable LC oscillator illustrated in FIG. 6 contains, as already described above with respect to the first embodiment of FIG. 2, a first differential amplifier VD1 and a second differential amplifier VD2 as a controllable constant current source.

By way of a connection point A11 the parallel resonant circuit LC is connected to the collector of the transistor T1 of the first differential amplifier VD1. The second connection for the resonant circuit is with the supply potential +UB. The diodes D1 and D2, serving for limiting the resonant circuit voltage, are component parts of the integrated circuit.

In the case of the differential amplifier VD2, operating as a constant current source, the diodes D5 and D6, connected between the base of the transistor T4 and a gound terminal M, are connected by way of the resistor RB with the supply potential +UB.

The adaptation of the potential differences occurs by way of two additional constant current sources having emitter followers connected as output stages.

The first additional constant current source comprises a transistor T5 whose emitter is connected to the ground terminal M by way of a resistor RE5. The collector of the transistor T5 is connected to the supply potential +UB by way of a resistor RC5. In addition, the base of an emitter follower transistor T7 is connected to the collector of the transistor T5. The emitter of the transistor T7 is connected to the base of the transistor T1 of the first differential amplifier and, by way of a resistor RE7, is connected to the ground terminal M. The collector of the transistor T7 is connected directly to the supply potential +UB.

The base of the transistor T5, connected as a constant current source, is connected to the base of the transistor T4 of the second differential amplifier and to the base of the transistor T6, the second additional constant current source.

The emitter of the transistor T6 is connected to the ground terminal M by way of a resistor RE6, and the collector of the transistor T6 is connected by way of a resistor RC6 to the connection point A11 of the parallel resonant circuit LC.

The base of a second emitter follower transistor T8 is connected to the collector of the transistor T6. The emitter of the transistor T8 is connected to the base of the transistor T2 of the first differential amplifier VD1 and to ground by way of a resistor RE8, while the collector of the transistor T8 is connected to the supply potential +UB.

The operation of the circuit corresponds to the operation of the first exemplary embodiment. The feedback of the resonant circuit voltage occurs from the connection point A11 of the oscillatory circuit by way of the resistor RC6 and the transistor T8 to the second input of the base of the transistor T2, of the first differential amplifier. The potential adaptation occurs by way of the constant currents, generated by the two additional constant sources, and the resistors RC5 and RC6 in the collector circuits of the transistors T5 and T6. Also, in this exemplary embodiment, only npn transistors are employed.

In the case of monolithic integration of the oscillator, in addition to the supply voltage terminals, only two additional connection points, one for the parallel resonant circuit and one for the control input, are required.

Figure 7:
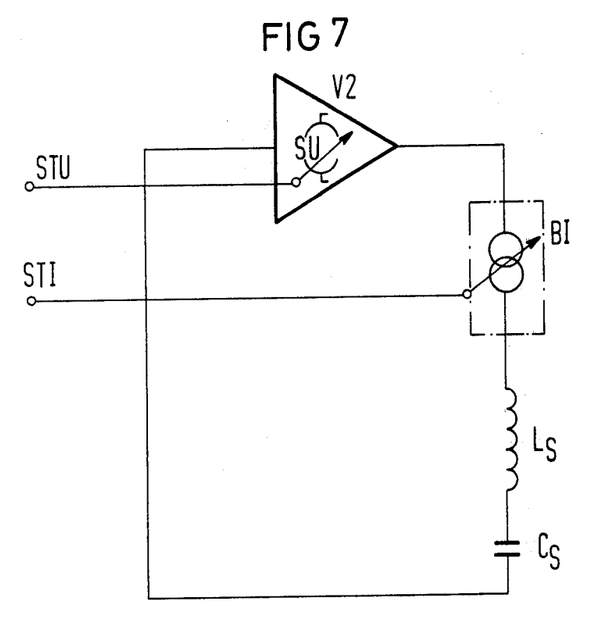
FIG. 7 illustrates a basic circuit diagram of a dual solution of an oscillator which is constructed in accordance with the present invention and which includes a series resonant circuit, a controlled voltage source and a controlled current limiter.

In FIG. 7, the basic circuit diagram of a dual solution of a controllable LC oscillator is illustrated. The LC oscillator comprises an amplifier V2 having an output which is connected to a current limiter BI, an inductor $L_S$ and a capacitor $C_S$, all in series. The resonant circuit is fed back to the input of the amplifier V2. The output voltage of the amplifier V2 is controllable by way of a control input STU.

As long as no limiting effect occurs, the oscillator oscillates with the radian frequency $$\omega_o = 1/\sqrt{LC} .$$

If, however, the output voltage of the amplifier V2 is increased, then the resonant circuit is limited by the current limiter BI. In a manner analogous to the oscillator circuit having a parallel resonant circuit, here, also, an altered oscillation period results. A further possibility for determining the beginning of the current limitation of the oscillator current, according to FIG. 6, is provided by controlling the current limiter BI by way of a control input STI.

The previously described impressed current source can again be employed as a current limiter.

The output voltage of the amplifier V2 can be controlled by way of its supply potentials.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications of the invention as may reasonably and properly be included within the scope of our contribution to the art.

We claim:

1. An oscillator whose frequency is controllable by a current change, comprising:
   an amplifier including an input and an output, including a constant current source having a control input for receiving a control signal which determines the output current of said amplifier, said amplifier comprising an emitter-coupled differential amplifier including first and second transistors each including an emitter connected to said emitter of the other and a collector connected to a supply potential, and said constant current source connected to said emitters;
   a parallel resonant circuit connected to said output and including a constant inductance and capacitance, said resonant circuit connected between said collector of said first transistor and the supply potential;
   a feedback connection connecting said parallel resonant circuit to said input of said amplifier; and
   a voltage limiter connected in parallel with said parallel resonant circuit.

2. The oscillator of claim 1, wherein:
   said constant current source comprises an emitter-coupled differential amplifier including
   third and fourth transistors each including a base, an emitter, and a collector,
   an emitter resistor connecting said emitters to a reference potential;
   fixed potential means connected to and providing a fixed potential to said base of said fourth transistor,
   said collector of said fourth transistor connected to said emitters of said first and second transistors,
   said collector of said third transistor connected to the supply potential, and
   said base of said third transistor adapted to receive the control signal.

3. The oscillator of claim 2, wherein:
   said voltage limiter comprises a pair of diodes connected anti-polar.

4. The oscillator of claim 3, wherein:
   said constant current source and said voltage limiter have the same relative temperature behavior.

5. The oscillator of claim 4, wherein
   each of said first and second transistors includes a base; and further comprising:
   a plurality of identical constant current sources including fifth, sixth, seventh and eighth transistors each including a base, an emitter and a collector;
   respective emitter resistors connecting said emitters to the reference potential;
   said bases of said fifth and sixth transistors connected to said fixed potential means for receiving the fixed potential;
   said collectors of said fifth and sixth transistors connected to said bases of said seventh and eighth transistors, respectively;
   a resistor connecting said base of said eighth transistor to said resonant circuit and to said collector of said first transistor;
   a further resistor connecting said base of said seventh transistor to the supply potential;
   said collectors of said seventh and eighth transistors connected to the supply potential; and
   said emitters of said seventh and eighth transistors connected to said bases of said first and second transistors respectively.

6. The oscillator of claim 5, wherein said oscillator is constructed as a monolithic integrated circuit.

7. An oscillator having an output frequency which is controllable by variation of an input control signal, comprising:
   amplifier means including an input, an output and a voltage source;
   current limiter means connected to said output; and
   a series resonant circuit connected in series with said current limiter means between said output and said input, said resonant circuit including constant inductance and capacitance,
   at least one of said means including a control signal input for receiving a control voltage which determines the output frequency.

8. The oscillator of claim 7, wherein:
   said one means is said amplifier means and said control input is connected to control said voltage source.

9. The oscillator of claim 7, wherein:
   said one means is said current limiter means.

10. The oscillator of claim 7, wherein:
    each of said means comprises a control input for a receiving a respective control voltage, the control input of said amplifier means connected to control said voltage source.

* * * * *